(12) United States Patent
Vangeel et al.

(10) Patent No.: US 10,985,930 B2
(45) Date of Patent: Apr. 20, 2021

(54) POE SYSTEM PROVIDING MEASURE OF ENERGY CONSUMPTION

(71) Applicant: PHILIPS LIGHTING HOLDING B.V., Eindhoven (NL)

(72) Inventors: Jurgen Mario Vangeel, Beerse (BE); Bas Marinus Johannus Van Berkel, Veghel (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 111 days.

(21) Appl. No.: 16/087,148

(22) PCT Filed: Mar. 16, 2017

(86) PCT No.: PCT/EP2017/056258
§ 371 (c)(1),
(2) Date: Sep. 21, 2018

(87) PCT Pub. No.: WO2017/162516
PCT Pub. Date: Sep. 28, 2017

(65) Prior Publication Data
US 2019/0103981 A1   Apr. 4, 2019

(30) Foreign Application Priority Data
Mar. 22, 2016 (EP) .................... 16161693

(51) Int. Cl.
*H04L 12/10* (2006.01)
*G06F 1/3203* (2019.01)
(Continued)

(52) U.S. Cl.
CPC ............ *H04L 12/10* (2013.01); *G06F 1/3203* (2013.01); *G06F 1/3209* (2013.01);
(Continued)

(58) Field of Classification Search
CPC . H04L 12/10; H04L 41/0833; G01R 21/1331; G06F 1/32; G06F 1/3203;
(Continued)

(56) References Cited

U.S. PATENT DOCUMENTS

2006/0149978 A1* 7/2006 Randall ................. G06F 1/3203
713/300
2009/0055672 A1   2/2009 Burkland et al.
(Continued)

FOREIGN PATENT DOCUMENTS

CN   101871985 A   10/2010
JP   2015095800 A   5/2015
(Continued)

*Primary Examiner* — Glenn A. Auve
(74) *Attorney, Agent, or Firm* — Akarsh P. Belagodu

(57) ABSTRACT

The invention relates to a PoE system, which comprises a powered device (2) and a power sourcing device (1). The power sourcing device comprises one or more ports (12) and the powered device is connectable to a port of the power sourcing device by an electrical conductor (13) for conveying the sourced power along with data. The powered device comprises an interface for providing a measure of its energy consumption within the PoE system and, if it does not have the ability to measure its energy consumption, is adapted to negotiate with the power sourcing device whether the power sourcing device has the ability to measure the energy consumption of the powered device and to provide the measured energy consumption to the powered device for provision via the interface. This can make the PoE system more flexible and allow for a single "point of contact" for providing energy usage feedback.

11 Claims, 4 Drawing Sheets

(51) Int. Cl.
*G06F 1/3209* (2019.01)
*H04L 12/24* (2006.01)
*G01R 21/133* (2006.01)

(52) U.S. Cl.
CPC ...... *H04L 41/0833* (2013.01); *G01R 21/1331* (2013.01); *Y02B 20/00* (2013.01); *Y02B 20/40* (2013.01); *Y02B 20/48* (2013.01)

(58) Field of Classification Search
CPC ....... G06F 1/3209; Y02B 20/00; Y02B 20/40; Y02B 20/48
See application file for complete search history.

(56) References Cited

U.S. PATENT DOCUMENTS

| | | |
|---|---|---|
| 2010/0007334 A1 | 1/2010 | Apfel |
| 2012/0131372 A1 | 5/2012 | Hibi |
| 2013/0158729 A1 | 6/2013 | Ghose et al. |
| 2013/0311114 A1 | 11/2013 | Jonsson |
| 2014/0129853 A1* | 5/2014 | Diab ............... H04L 12/413 713/310 |
| 2014/0195831 A1 | 7/2014 | Hamdi et al. |
| 2016/0164688 A1* | 6/2016 | Yseboodt ............ H05B 47/18 307/1 |
| 2016/0179154 A1* | 6/2016 | Lai .................... G06F 1/266 713/310 |
| 2016/0204949 A1* | 7/2016 | Theunissen ......... H05B 47/18 307/1 |
| 2019/0123557 A1* | 4/2019 | Ming Pui ...... G01R 19/16528 |

FOREIGN PATENT DOCUMENTS

| | | |
|---|---|---|
| WO | 2011055975 A2 | 5/2011 |
| WO | 2015144457 A1 | 10/2015 |
| WO | 2017036702 A1 | 3/2017 |

\* cited by examiner

POE SYSTEM PROVIDING MEASURE OF ENERGY CONSUMPTION

CROSS-REFERENCE TO PRIOR APPLICATIONS

This application is the U.S. National Phase application under 35 U.S.C. § 371 of International Application No. PCT/EP2017/056258, filed on Mar. 16, 2017, which claims the benefit of European Patent Application No. 16161693.3, filed on Mar. 22, 2016. These applications are hereby incorporated by reference herein.

FIELD OF THE INVENTION

The present invention relates to a PoE system comprising a powered device and a power sourcing device for sourcing a power to the powered device, wherein the power sourcing device comprises one or more ports and the powered device is connectable to a port of the power sourcing device by an electrical conductor for conveying the sourced power along with data. The invention further relates to a power sourcing device and a powered device for being used in the PoE system. Moreover, the invention relates to a method for providing a measure of an energy consumption of the powered device in the PoE system.

BACKGROUND OF THE INVENTION

Today, many modern lighting systems make use of Power-over-Ethernet (PoE) technology (e.g., IEEE 802.3af or IEEE 802.3at), which allows a power sourcing device (power sourcing equipment; PSE) to source a power to one or several powered devices (PD) via one or several Ethernet cables. In these Lighting-over-Ethernet (LoE) systems, the powered devices can include intelligent luminaires equipped with (environmental) sensors, such as presence sensors, daylight sensors, et cetera, and logic that can be controlled by the sensor signals and through data conveyed by the power sourcing device along with the sourced power over the Ethernet cables. In larger lighting installations, for instance, in office spaces or other work places, this can provide a very granular grid of sensor information, since the luminaires may typically be installed every one to two meters.

In addition to an improved control over the luminaires, the prospect of achieving energy savings is also an important reason for customers to switch from conventional lighting solutions to LoE systems. As such, the customers expect a LoE system to provide feedback on energy usage and, possibly, realized savings. For this reason, the luminaires are often also equipped with specific circuitry for measuring their energy consumption. This specific circuitry, however, can add cost to the luminaires, resulting in an increased cost of the overall LoE system.

SUMMARY OF THE INVENTION

It is an object of the present invention to provide a PoE system, such as an LoE system, that allows providing a measure of the energy consumption of a powered device, for instance, a luminaire, in a flexible and potentially cost efficient manner. It is a further object of the invention to provide a power sourcing device and a powered device for being used in the PoE system. Moreover, it is an object of the invention to provide a method for providing a measure of an energy consumption of the powered device in the PoE system.

In a first aspect of the present invention, a PoE system is presented, wherein the PoE system comprises:

a powered device and a power sourcing device for sourcing a power to the powered device, wherein the power sourcing device comprises one or more ports and the powered device is connectable to a port of the power sourcing device by an electrical conductor for conveying the sourced power along with data, wherein the powered device comprises an interface for providing a measure of its energy consumption within the PoE system, wherein the powered device, if it does not have the ability to measure its energy consumption, is adapted to negotiate with the power sourcing device whether the power sourcing device has the ability to measure the energy consumption of the powered device and to provide the measured energy consumption to the powered device for provision via the interface.

Since the powered device, for instance, a luminaire, comprises an interface for providing a measure of its energy consumption within the PoE system, a feedback on energy usage can be given to a user of the PoE system. Moreover, since the powered device, if it does not have the ability to measure its energy consumption, is adapted to negotiate with the power sourcing device whether the power sourcing device has the ability to measure the energy consumption of the powered device and to provide the measured energy consumption to the powered device for provision via the interface, the PoE system can be more flexible. For instance, if the powered device does not comprise specific circuitry for measuring its energy consumption, the measuring may be performed by the power sourcing device if it has the measuring ability. Even in this case, the measure of the energy consumption of the powered device can be provided via the interface of the powered device, such that a single "point of contact" can be used for providing the feedback on the energy usage.

Preferably, the power sourcing device and the powered device are both PoE devices and the electrical conductor is an Ethernet cable, such as a CAT5 (Category 5) or a CAT6 (Category 6) cable. The power sourcing device, which can also be regarded as being a PSE, may be an endspan device, such as a switch, or a midspan device, such as a PoE injector.

The negotiation between the powered device and the power sourcing device can be based on any suitable communication protocol, preferably the Link Layer Discovery Protocol (LLDP), which provides a standardized mechanism for the powered device to negotiate with the power sourcing device using Ethernet frames. An extension of the current LLDP may be adapted to allow the powered device to request its energy consumption from the power sourcing device on the level of the port to which the powered device is connected by the electrical conductor (see below).

The interface that is provided by the powered device can be based on any suitable protocol for providing the measure of its energy consumption within the PoE system. In certain embodiments, the PoE system comprises further network elements, such as a gateway or the like. The gateway may be adapted to allow the PoE system to be connected to another PoE system and the powered device may be adapted to provide the measure of its energy consumption via the power sourcing device to the gateway. The gateway may then preferably also act as an aggregator device that aggregates the energy consumption measurements for the one or several powered devices that are comprised by the PoE system. The PoE system may further comprise a device, such as a display or monitor or the like, for visualizing the energy consumption measurements to a user of the PoE system. Moreover, the PoE system may employ a cloud-based service in order to store and manage the energy consumption measurements.

It is preferred that, if the power sourcing device has the measuring ability, the power sourcing device is further adapted to measure the energy consumption of the powered device and to provide the measured energy consumption to the powered device. In this case, the powered device does not require specific circuitry for measuring its energy consumption, which can potentially reduce the costs for the overall PoE system.

In one variant, the power sourcing device is adapted to measure the energy consumption of the powered device on the level of the port to which the powered device is connected by the electrical conductor. This can allow for a particularly accurate measurement of the energy consumption of the individual powered device. For instance, the measurement performed by the power sourcing device can also take losses occurring in the electrical conductor into account. In one realization, the power sourcing device may comprise for each port specific circuitry for measuring a voltage and a current sourced by the power sourcing device to a powered device connected to the port by an electrical conductor. From these measurements, the energy consumption of the powered device can then be calculated by taking the product of voltage and current and by integrating this product over time, as it is known in the art. Since the power sourcing device may not have the same low cost requirements as the powered devices, for instance, the luminaires in an LoE system, the specific circuitry comprised by the power sourcing device may be more complex and, thus, more accurate than the more cost sensitive solutions that would typically be employed in the powered devices.

In another variant, the power sourcing device is adapted to measure a total energy consumption for all ports of the power sourcing device and to determine the measured energy consumption of the powered device based on the measured total energy consumption and the number of the ports to which a powered device is connected. This may be realized by providing the power sourcing device with specific circuitry for measuring a voltage and a current at the input power side of the power sourcing device. From these measurements, the measured total energy consumption can then be calculated by taking the product of voltage and current and by integrating this product over time, as it is known in the art. Knowing the number of ports to which a powered device is connected, an estimate (guess) can then be made on the energy consumption of the powered device. For instance, the measured energy consumption of the powered device can be estimated to equal the measured total energy consumption divided by the number of ports to which a powered device is connected.

It is preferred that, if the powered device does not have the measuring ability, the powered device is adapted, if also the power sourcing device does not have the measuring ability, to estimate its energy consumption and to provide the estimated energy consumption via the interface. In particular, it is preferred that the powered device is a luminaire and that the powered device is adapted to estimate its energy consumption based on a current light output and/or estimated standby losses. In one possible realization, the powered device, for instance, a luminaire, can be adapted to have available or to calculate the energy that is consumed by its individual components, such as a microcontroller or driver circuitry, in standby mode. Moreover, since it is typically known for a specific luminaire what the maximum output power is when the luminaire is driven to its highest light output level, the current power $P_{curr}$ may be calculated as follows: $P_{curr}=D \cdot P_{out,max}+L_{standby}$, where D is the current dimming level of the luminaire in percentage, $P_{out,max}$ is the maximum output power and $L_{standby}$ are the standby losses. From the calculated current power $P_{curr}$, the energy consumption can then be calculated by integration over time, as it is known in the art.

In an embodiment, if the powered device has the measuring ability, the powered device is adapted to measure its energy consumption and to provide the measured energy consumption via the interface.

In another embodiment, also if the powered device has the measuring ability, for instance, comprises specific circuitry for measuring its energy consumption, the powered device is adapted to negotiate with the power sourcing device whether the power sourcing device has the ability to measure the energy consumption of the powered device and to provide the measured energy consumption to the powered device for provision via the interface. This can be advantageous, since the power sourcing device may be able to measure the energy consumption of the powered device with a greater accuracy than the powered device itself. For instance, the measurement performed by the power sourcing device can also take losses occurring in the electrical conductor into account (see above).

Preferably, also the power sourcing device comprises an interface for providing a measure of the energy consumption of the powered device within the PoE system. In particular, the power sourcing device can be adapted to provide energy consumption measurements via the interface on a per-port basis. Thus, the measure of the energy consumption of a powered device that is connected to a particular port can also be retrieved from the power sourcing device.

In a further aspect of the present invention, a power sourcing device for being used in a PoE system as defined in claim 1 is presented, wherein the power sourcing device is adapted to engage in a negotiation from the powered device whether the power sourcing device has the ability to measure the energy consumption of the powered device and to provide the measured energy consumption to the powered device for provision within the PoE system via an interface of the powered device.

In yet a further aspect of the present invention, a powered device for being used in a PoE system as defined in claim 1 is presented, wherein the powered device comprises an interface for providing a measure of its energy consumption within the PoE system, wherein the powered device, if it does not have the ability to measure its energy consumption, is adapted to negotiate with the power sourcing device whether the power sourcing device has the ability to measure the energy consumption of the powered device and to provide the measured energy consumption to the powered device for provision via the interface.

In another aspect of the present invention, a method for providing a measure of an energy consumption of a powered device in a PoE system comprising the powered device and a power sourcing device for sourcing a power to the powered device is presented, wherein the power sourcing device comprises one or more ports and the powered device is connectable to a port of the power sourcing device by an electrical conductor for conveying the sourced power along with data, wherein the method comprises:

the powered device providing a measure of its energy consumption within the PoE system via an interface of the powered device, wherein the powered device, if it does not have the ability to measure its energy consumption, negotiates with the power sourcing device whether the power sourcing device has the ability to measure the energy consumption of the powered device and to provide the measured energy consumption to the powered device for provision via the interface.

In a further aspect of the present invention, a computer program for controlling a PoE system as defined in claim 1 is presented, wherein the computer program comprises program code means for causing the PoE system to carry out the method as defined in claim 11, when the computer program is run on the PoE system.

The computer program may comprise several subprograms, wherein, for instance, a first subprogram may be implemented on the power sourcing device and a second subprogram may be implemented on the powered device in order to control these elements in accordance with the method.

It shall be understood that the PoE system of claim 1, the power sourcing device of claim 9, the powered device of claim 10, and the method of claim 11 have similar and/or identical preferred embodiments, in particular, as defined in the dependent claims.

It shall be understood that a preferred embodiment of the present invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
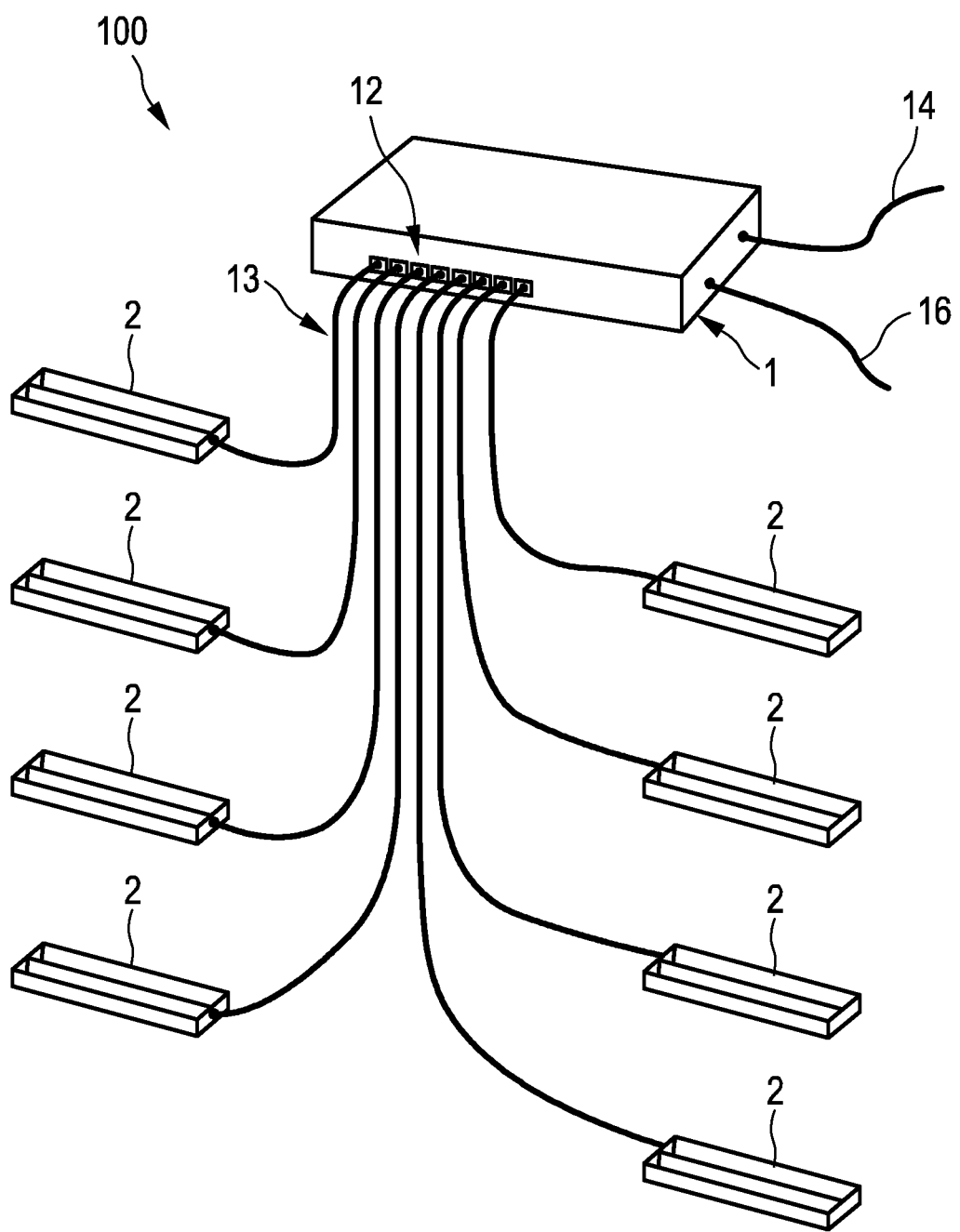
FIG. 1 shows schematically and exemplarily an embodiment of a PoE system.
Figure 2:
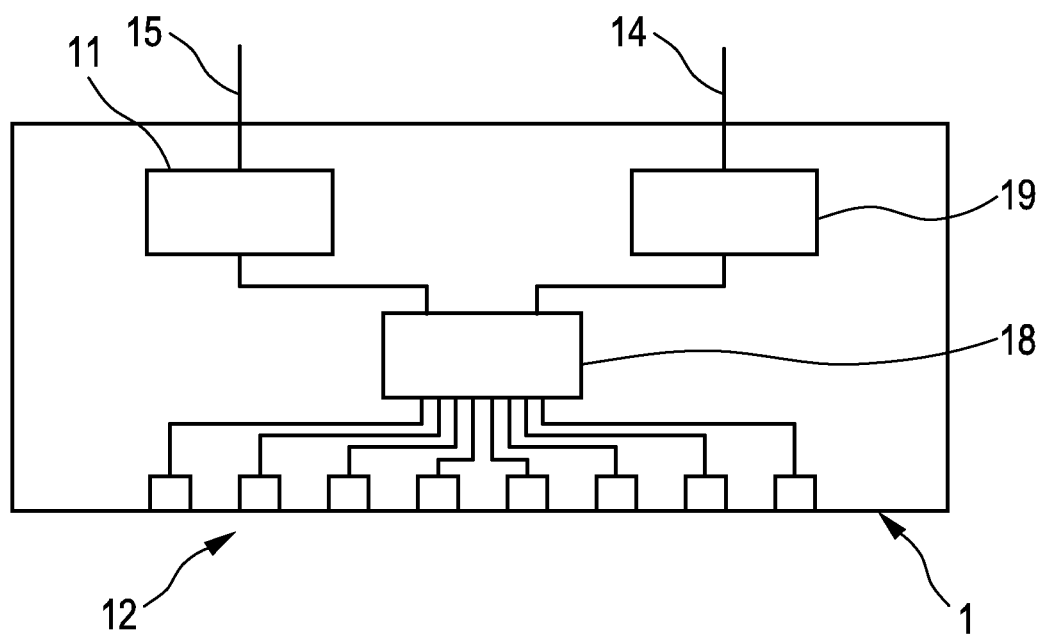
FIG. 2 shows schematically and exemplarily a power sourcing device of the PoE system shown in FIG. 1.

FIG. 1 shows schematically and exemplarily an embodiment of a PoE system 100 comprising a power sourcing device 1, here, a switch, for sourcing a power to powered devices 2. The switch 1 is schematically and exemplarily shown in more detail in FIG. 2.

The switch 1 comprises several ports 12 to which the powered devices 2 are connected via electrical conductors 13, here, Ethernet cables, which are adapted to convey the sourced power along with data. The switch 1 receives an input power via an electrical connection 15 that may be directly connected to a mains outlet (not shown in the figure), and the data may be received from another device (not shown in the figure), e.g., another switch, via another Ethernet cable 14. From the received power, a power supply unit 11 generates the power to be sourced to the powered devices 2 via a power device manager 18. The data may be processed by a network data processor 19 before being sent to a respective powered device 2 via the power device manager 18.

In FIG. 1, the powered devices 2 include luminaires, which may be intelligent luminaires equipped with (environmental) sensors, such as presence sensors, daylight sensors, et cetera, and logic (all not shown in the figure) that can be controlled by the sensor signals and through the data conveyed by the switch 1 along with the sourced power over the Ethernet cables 13.

Figure 3:
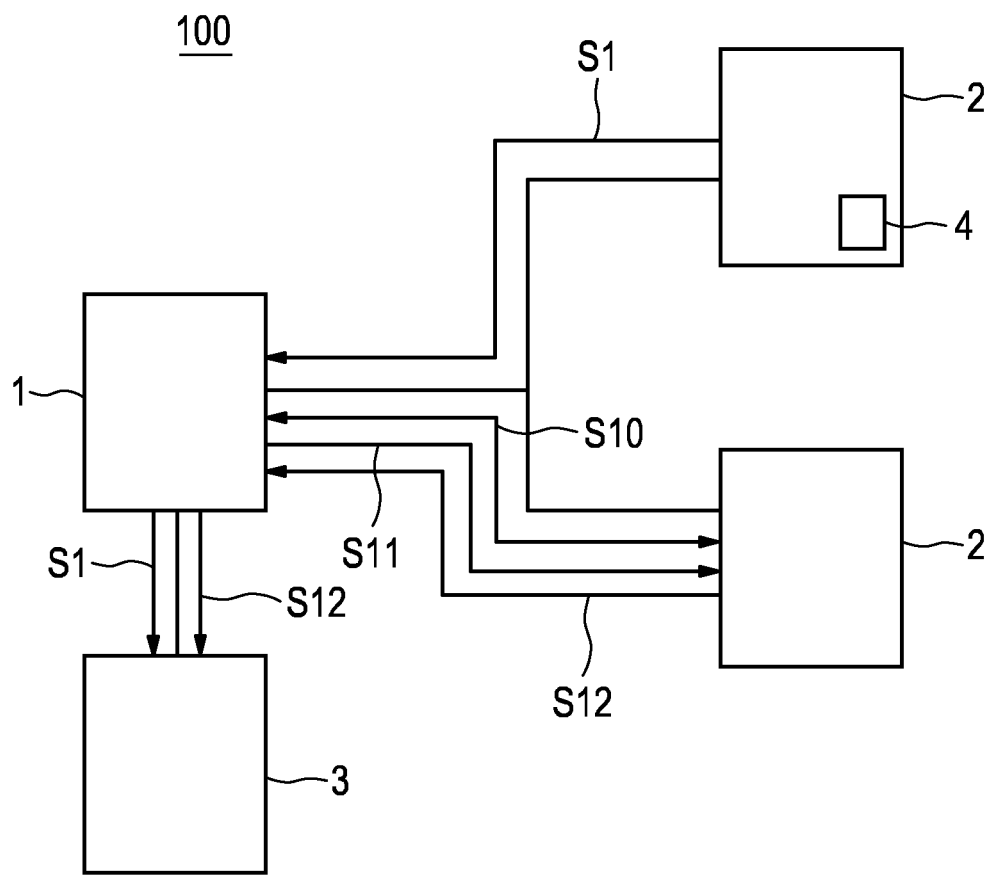
FIG. 3 shows schematically and exemplarily a system overview of the PoE system shown in FIG. 1.

FIG. 3 shows schematically and exemplarily a system overview of the PoE system 100 shown in FIG. 1. In addition to the switch 1 and the luminaires 2, the PoE system 100, here, further comprises an additional network element 3, in this case, a gateway that allows the PoE system 100 to be connected to another PoE system (not shown in the figure). The overview shows both the case where the luminaire 2 comprises specific circuitry 4 for measuring its energy consumption (upper right side of the figure) and the case where the luminaire 2 does not have the ability to measure its energy consumption (lower right side of the figure). In both cases, the luminaire 2 comprises an interface for providing a measure of its energy consumption within the PoE system 100. However, a difference between the two cases exists in that, in this embodiment, in the first case, in which the luminaire 2 has the ability to measure its energy consumption, the luminaire 2 measures its energy consumption and immediately provides, in one or more messages S1, the measure of its energy consumption via the interface, here, via the switch 1 to the gateway 3. In contrast, in the second case, in which the luminaire 2 does not have the ability to measure its energy consumption, the luminaire 2 negotiates, in one or more messages S10, with the switch 1 whether the switch 1 has the ability to measure the energy consumption of the luminaire 2 and to provide the measured energy consumption to the luminaire 2 for provision via the interface. In this example, this is indeed the case, wherefore the switch 1 measures the energy consumption of the luminaire 2 and provides, in one or more messages S11, the measured energy consumption to the powered device 2. The luminaire 2 then provides, in one or more messages S12, the measured energy consumption via the interface, here, via the switch 1 to the gateway 3. Since even in this case, the measure of the energy consumption of the luminaire 2 can be provided via the interface of the luminaire 2, a single "point of contact" can be used for providing feedback on the energy usage.

The interface that is provided by the luminaire 2 can be based on any suitable protocol for providing the measure of its energy consumption within the PoE system 100, here, via the switch 1 to the gateway 3. In this example, the gateway 3 acts as an aggregator device that aggregates the energy consumption measurements for the several powered devices 2 that are comprised by the PoE system 100. The PoE system 100 may further comprise a device, such as a display or monitor or the like, for visualizing the energy consumption measurements to a user of the PoE system 100 (not shown in the figure). Moreover, the PoE system 100 may employ a cloud-based service in order to store and manage the energy consumption measurements.

Figure 4:
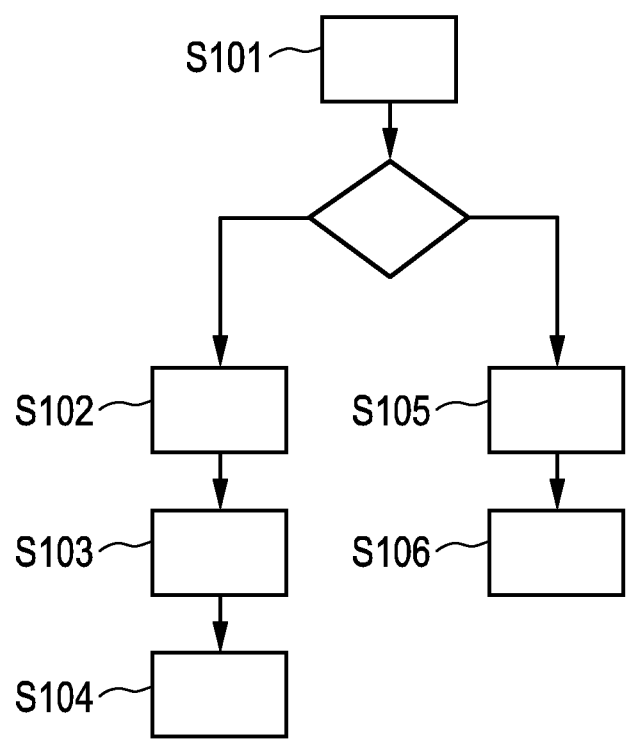
FIG. 4 shows a flowchart exemplarily illustrating an embodiment of a method for providing a measure of an energy consumption of a powered device in the PoE system shown in FIG. 1.

FIG. 4 shows a flowchart exemplarily illustrating an embodiment of a method for providing a measure of an energy consumption of a powered device 2 in the PoE system 100 shown in FIG. 1. As described with reference to FIGS. 1 to 3 above, in this embodiment, the power sourcing device 1 is a switch and the powered device 2 is a luminaire that comprises an interface for providing a measure of its energy consumption within the PoE system 100.

In step S101, the luminaire 2, if it does not have the ability to measure its energy consumption, negotiates with the switch 1 whether the switch 1 has the ability to measure the energy consumption of the luminaire 2 and to provide the measured energy consumption to the luminaire 2 for provision via the interface. This negotiation may be performed, for instance, by the luminaire 2 querying the switch 1 whether the switch 1 has the ability to measure the energy consumption of the luminaire 2 and to provide the measured energy consumption to the luminaire 2 for provision via the interface. The switch 1 may then either confirm or negate its measuring ability.

The negotiation between the luminaire 2 and the switch 1 can be based on any suitable communication protocol, preferably the Link Layer Discovery Protocol (LLDP), which provides a standardized mechanism for the luminaire 2 to negotiate with the switch 1 using Ethernet frames. An extension of the current LLDP may be adapted to allow the luminaire 2 to request its energy consumption from the switch 1 on the level of the port to which the luminaire 2 is connected by the Ethernet cable 13 (see below).

If the switch 1 has the measuring ability (left branch of the figure), the switch 1, in step S102, measures the energy consumption of the luminaire 2 and, in step S103, provides the measured energy consumption to the luminaire 2.

In one variant, the switch 1 is adapted to measure the energy consumption of the luminaire 2 on the level of the port 12 to which the luminaire 2 is connected by the Ethernet cable 13. This can allow for a particularly accurate measurement of the energy consumption of the individual powered device, here, the luminaire 2. For instance, here, the measurement performed by the switch 1 also takes losses occurring in the Ethernet cable 13 into account. In one realization, the switch 1 comprises for each port 12 specific circuitry (not shown in the figure) for measuring a voltage and a current sourced by the switch 1 to a powered device, here, the luminaire 2, connected to the port 12 by the Ethernet cable 13. From these measurements, the energy consumption of the luminaire 2 are then calculated by taking the product of voltage and current and by integrating this product over time, as it is known in the art. Since the switch 1 may not have the same low cost requirements as the luminaires 2, the specific circuitry comprised by the switch 1 may be more complex and, thus, more accurate, than the more cost sensitive solutions that would typically be employed in the luminaires 2.

In another variant, the switch 1 is adapted to measure a total energy consumption for all ports 12 of the switch 1 and to determine the measured energy consumption of the luminaire 2 based on the measured total energy consumption and the number of the ports 12 to which a powered device, here, a luminaire 2, is connected. This may be realized by providing the switch 1 with specific circuitry for measuring a voltage and a current at the input power side of the switch 1. From these measurements, the measured total energy consumption is then calculated by taking the product of voltage and current and by integrating this product over time, as it is known in the art. Knowing the number of ports 12 to which a powered device (luminaire 2) is connected, an estimate (guess) can then be made on the energy consumption of the luminaire 2. For instance, the measured energy consumption of the luminaire 2 can be estimated to equal the measured total energy consumption divided by the number of ports to which a powered device (luminaire 2) is connected.

In step S104, the luminaire 2 then provides the measured energy consumption via the interface.

In contrast, if also the switch 1 does not have the measuring ability (right branch of the figure), in step S105, the luminaire 2 estimates its energy consumption and, in step S106, provides the estimated energy consumption via the interface. In one possible realization, the luminaire 2 has available or calculates the energy that is consumed by its individual components, such as a microcontroller or driver circuitry (not shown in the figures), in standby mode. Moreover, since it is known what the maximum output power is when the luminaire 2 is driven to its highest light output level, the current power $P_{curr}$ is calculated as follows: $P_{curr} = D \cdot P_{out,max} + L_{standby}$, where D is the current dimming level of the luminaire 2 in percentage, $P_{out,max}$ is the maximum output power and $L_{standby}$ are the standby losses. From the calculated current power $P_{curr}$, the energy consumption is then calculated by integration over time, as it is known in the art.

While in the system overview of the PoE system 100 shown in FIG. 1, which is shown in FIG. 3, the luminaire 2 that has the ability to measure its energy consumption (upper right side of the figure) measures its energy consumption and immediately provides, in one or more messages S11, the measure of its energy consumption via the interface, this does not have to be the case. In particular, it is also possible that also if the luminaire 2 has the measuring ability, the luminaire 2 negotiates with the switch 1 whether the switch 1 has the ability to measure the energy consumption of the luminaire 2 and to provide the measured energy consumption to the luminaire 2 for provision via the interface. This can be advantageous, since the switch 1 may be able to measure the energy consumption of the luminaire 2 with a greater accuracy than the luminaire 2 itself. For instance, the measurement performed by the switch 1 can also take losses occurring in the electrical conductor 13 into account.

The present invention also foresees a power sourcing device 1 for being used in a PoE system 100 as described above. The power sourcing device 1, here, the switch, is adapted to engage in a negotiation from the powered device 2, here, the luminaire, whether the power sourcing device 1 has the ability to measure the energy consumption of the powered device 2 and to provide the measured energy consumption to the powered device 2 for provision within the PoE system 100 via the interface of the powered device 2.

The invention further foresees a powered device 2 for being used in a PoE system 100 as described above. The powered device 2, here, the luminaire, comprises an interface for providing a measure of its energy consumption within the PoE system 100, wherein the powered device 2, if it does not have the ability to measure its energy consumption, is adapted to negotiate with the power sourcing device 1, here, the switch, whether the power sourcing device 1 has the ability to measure the energy consumption of the powered device 2 and to provide the measured energy consumption to the powered device 2 for provision via the interface.

Although in the above-described embodiments, luminaires have been described as the powered devices 2, in other embodiments, the powered devices 2 can additionally or alternatively include also other electrical devices like switching elements, fans, user interfaces such as displays or switch panels, et cetera.

The one or several luminaires 2 that are comprised by the described PoE system 100, preferably employ light-emitting diodes (LEDs). Such LEDs may use about 25% to 80% less energy than traditional incandescent lights, potentially saving the user of the PoE system 100 significant energy and costs. However, it is also possible that the one or several luminaires 2 employ laser, organic light-emitting diodes (OLEDs) or other lighting elements that can be powered in the PoE system 100.

In the above-described embodiments, the gateway 3 may further be adapted to act as an area controller device for controlling the powered devices, here, the luminaires 2, in a certain area, for instance, in a room or the like.

It is possible that also the power sourcing device, for instance, the switch 1, comprises an interface for providing a measure of the energy consumption of the powered device, for instance the luminaire 2, within the PoE system. In particular, the power sourcing device can be adapted to provide energy consumption measurements via the interface on a per-port basis. Thus, the measure of the energy consumption of a powered device that is connected to a particular port can also be retrieved from the power sourcing device.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or devices may fulfill the functions of several items recited in the claims. The mere fact that certain measures are recited in mutually different dependent claims does not indicate that a combination of these measures cannot be used to advantage.

Procedures like the negotiation of the powered device with the power sourcing device, the measurement of the energy consumption of the powered device by the power sourcing device et cetera performed by one or several units or devices can be performed by any other number of units or devices. These procedures and/or the control of the PoE system in accordance with the method can be implemented as program code means of a computer program and/or as specific hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention relates to a PoE system, preferentially an LoE system, which comprises a powered device and a power sourcing device. The power sourcing device comprises one or more ports and the powered device is connectable to a port of the power sourcing device by an electrical conductor for conveying the sourced power along with data. The powered device comprises an interface for providing a measure of its energy consumption within the PoE system and, if it does not have the ability to measure its energy consumption, is adapted to negotiate with the power sourcing device whether the power sourcing device has the ability to measure the energy consumption of the powered device and to provide the measured energy consumption to the powered device for provision via the interface. This can make the PoE system more flexible and allow for a single "point of contact" for providing energy usage feedback.

The invention claimed is:

1. A Power over Ethernet ("PoE") system, wherein the PoE system comprises:

a powered device, and a power sourcing device for providing a power to the powered device, wherein the power sourcing device comprises one or more ports, wherein the powered device is connectable to a port of the power sourcing device by an electrical conductor for conveying the power along with data, wherein the powered device comprises an interface for providing a measure of an energy consumption of the powered device within the PoE system, wherein the powered device is adapted to query the power sourcing device for the energy consumption of the powered device, wherein the query is based on a communication protocol which provides a standardized mechanism for the powered device to query the power sourcing device using Ethernet frames; and wherein the power sourcing device is adapted to measure the energy consumption of the powered device and to, when queried by the powered device, provide the measured energy consumption to the powered device for provision via the interface.

2. The PoE system as defined in claim 1, wherein the power sourcing device is adapted to measure the energy consumption of the powered device based on the port to which the powered device is connected by the electrical conductor.

3. The PoE system as defined in claim 1, wherein the power sourcing device is adapted to measure a total energy consumption for all ports of the power sourcing device and to determine the measured energy consumption of the powered device based on the measured total energy consumption and a number of the ports to which a powered device is connected.

4. The PoE system as defined in claim 1, wherein the powered device is further adapted to estimate its energy consumption and to provide the estimated energy consumption via the interface.

5. The PoE system as defined in claim 4, wherein the powered device is a luminaire and the powered device is adapted to estimate its energy consumption based on a current light output and/or estimated standby losses.

6. The PoE system as defined in claim 1, wherein the powered device is further adapted to measure its energy consumption and to provide the measured energy consumption via the interface.

7. The PoE system as defined in claim 1, wherein also the power sourcing device comprises an interface for providing a measure of the energy consumption of the powered device within the PoE system.

8. The PoE system as defined in claim 1, wherein the powered device is a luminaire.

9. A power sourcing device for being used in a PoE system as defined in claim 1, wherein the power sourcing device is adapted to provide the measured energy consumption to the powered device for provision within the PoE system via the interface of the powered device.

10. A powered device for being used in a PoE system as defined in claim 1, wherein the powered device comprises an interface for providing a measure of an energy consumption of the powered device within the PoE system, and wherein the powered device is adapted to query the power sourcing device for the energy consumption of the powered device and to receive the measured energy consumption from the power sourcing device for provision via the interface.

11. A method for providing a measure of an energy consumption of a powered device in a PoE system comprising the powered device and a power sourcing device for sourcing a power to the powered device, wherein the power sourcing device comprises one or more ports and the powered device is connectable to a port of the power sourcing device by an electrical conductor for conveying the power along with data, wherein the method comprises:

the powered device querying the power sourcing device for the energy consumption of the powered device, wherein the query is based on a communication protocol which provides a standardized mechanism for the powered device to query the power sourcing device using Ethernet frames, the power sourcing device providing the measured energy consumption to the powered device, the powered device providing a measure of its energy consumption within the PoE system via an interface of the powered device.

\* \* \* \* \*